United States Patent
Pan et al.

(10) Patent No.: US 8,293,008 B2
(45) Date of Patent: Oct. 23, 2012

(54) LARGE-SIZED BISMUTH-ZINC-BORATE NONLINEAR OPTICAL CRYSTAL AND PREPARATION METHODS AND APPLICATIONS THEREOF

(75) Inventors: Shilie Pan, Urumqi (CN); Feng Li, Urumqi (CN); Xueling Hou, Urumqi (CN)

(73) Assignee: Xingjiang Technical Institute of Physics & Chemistry, Chinese Academy of Sciences, Urumuqi (CN)

( * ) Notice: Subject to any disclaimer, the term of this patent is extended or adjusted under 35 U.S.C. 154(b) by 866 days.

(21) Appl. No.: 12/420,526

(22) Filed: Apr. 8, 2009

(65) Prior Publication Data

US 2009/0262763 A1    Oct. 22, 2009

(30) Foreign Application Priority Data

Apr. 17, 2008    (CN) .......................... 2008 1 0072858

(51) Int. Cl.
C30B 15/20    (2006.01)
(52) U.S. Cl. ................. 117/13; 117/15; 117/17; 117/30
(58) Field of Classification Search .................... 117/13, 117/15, 17, 30
See application file for complete search history.

(56) References Cited

PUBLICATIONS

Kurtz, et al. "A Powder Technique for the Evaluation of Nonlinear Optical Materials" Journal of Applied Physics. vol. 39, Issue 8. pp. 3798-3812 (Jul. 1968).
Reshak, et al. "Specific features of second order optical susceptibilities for a complex borate crystal Bi2ZnB2O7: Experiment and theory" Current Opinion in Solid State and Materials Science. vol. 11, Issue 3-4, pp. 33-39 (2007).
Barbier, et al. "Melilite-Type Borates Bi2ZnB2O7 and CaBiGaB2O7" Chemistry of Materials. vol. 17, pp. 3130-3136 (2005).
Li, et al. "Synthesis, Crystal Structure and Optical Properties of Non-centrosymmetric Borate, Bi2ZnB2O7" Journal of Synthetic Crystal. vol. 36, No. 5 (Oct. 2007).

*Primary Examiner* — Bob M Kunemund
(74) *Attorney, Agent, or Firm* — Robert E. Bushnell, Esq.

(57) ABSTRACT

The present invention relates to a large-sized and high-quality bismuth-zinc-borate ($Bi_2ZnB_2O_7$) single crystal, preparation methods and applications thereof. The crystal has cross-sectional dimensions greater than one centimeter, a nonlinear optical effect of about 3-4 times that of $KH_2PO_4$ (KDP), and an optical transmission wavelength range of 330-3300 nm. The crystal can be grown from a compound melt by a Czochralski method, a Kyropoulos method or a Bridgman method with the raw material being the synthetic compound $Bi_2ZnB_2O_7$. Alternatively, the crystal may be grown from a high-temperature solution method by using $Bi_2O_3$ as a flux. The crystal may be applied in nonlinear optical devices such as frequency doubling generators, frequency upconverters or downconverters, and optical parametric oscillators.

18 Claims, 4 Drawing Sheets

US 8,293,008 B2

LARGE-SIZED BISMUTH-ZINC-BORATE NONLINEAR OPTICAL CRYSTAL AND PREPARATION METHODS AND APPLICATIONS THEREOF

CLAIM OF PRIORITY

This application makes reference to, incorporates the same herein, and claims all benefits accruing under 35 U.S.C. §119 from an application earlier filed in the State Intellectual Property Office of the Peoples Republic of China on Apr. 17, 2008, and there duly assigned Serial No. 200810072858.3.

BACKGROUND

1. Field of the Invention

The present invention relates to large-sized bismuth-zinc-borate nonlinear optical crystals, and more particularly to large-sized and high-quality bismuth-zinc-borate ($Bi_2ZnB_2O_7$) single crystals grown from bismuth-zinc-borate ($Bi_2ZnB_2O_7$) compound melt or from $Bi_2O_3$ flux, and to the applications of nonlinear optical devices made of $Bi_2ZnB_2O_7$ crystals.

2. Description of the Prior Art

In laser technology, the laser wavebands obtained directly from emissions by laser crystals are limited. Therefore, there still exist blank, unused wavebands within the ultraviolet to infrared spectral zone. By utilizing nonlinear optical crystals, these limited laser wavelengths can be converted into new laser wavebands through nonlinear optical techniques, which include frequency doubling, sum-frequency, optical parameter oscillation. By these techniques, blank spectral zones of wavelengths emitted by various laser devices can be exploited, and applications of laser generators can be more intensively developed.

An all-solid-state blue-green laser system could be realized by generating a near-infrared wavelength laser beam from a solid-state laser apparatus and subsequently converting the frequency of the near-infrared laser by using a nonlinear optical crystal. Such systems have great potential for applications in the field of laser technology and are of substantial economic value.

Until now, the main nonlinear optical materials used for the frequency conversion within the blue-green waveband have been $KTiOPO_4$ (KTP) crystal, $\beta$-$BaB_2O_4$ (BBO) crystal and $LiB_3O_5$ (LBO) crystal. These materials have disadvantages with respect to crystal growth. Specifically, KTP and LBO need to be grown by a flux method because they are non-congruent melting compounds; BBO also needs to be grown by the flux method because $BaB_2O_4$ has a phase transition and BBO only exists in a low-temperature phase. The flux method refers to a method in which precursor intentionally contains an excess component or a non-product appearing component. These excellent nonlinear optical crystals have low growth rates, are difficult to obtain as large-sized crystals and incur high costs because it is necessary to grow them by the flux method. These disadvantages of the contemporary nonlinear optical materials have unfavorably influenced large-scale development of all-solid-state blue-green laser systems. Therefore, not only the optical properties and mechanical properties of a crystal have received a lot of attention, but also the preparation method of the crystal has received more and more attention in recent years.

As a general rule, a new crystal is expected to be easily prepared. It is better for that crystal to be a congruent melting compound in order to grow the single crystal by a melt method. Thereby, low-cost, large-sized and high-quality nonlinear optical crystals can be obtained.

The existence of the bismuth-zinc-borate ($Bi_2ZnB_2O_7$) compound, the powder X-ray diffraction data and the powder neutron diffraction data of the compound were reported by the Canadian, Jacques Barbier (Chem. Mater., Vol. 17(12), 3130-3136 (2005)). In order to measure the essential physical properties (including the nonlinear optical properties) of a single crystal, it is required that a single crystal has a size as large as several millimeters and, preferably, a size at the centimeter-level. Until now, a successful preparation of $Bi_2ZnB_2O_7$ single crystals in a size large enough for the measurement of physical properties has not been reported. Furthermore, it is impossible to purchase these crystals in the market. To date, neither the measurement results of the nonlinear optical properties of $Bi_2ZnB_2O_7$ single crystals nor the application of $Bi_2ZnB_2O_7$ single crystals to the fabrication of nonlinear optical devices has been reported.

The present application refers to and hereby incorporates by reference the following references:

Jacques Barbier, et al, "Melilite-Type Borates $Bi_2ZnB_2O_7$ and $CaBiGaB_2O_7$" Chemistry of Materials, 17, pp. 3130-3136, 2005.

Ming Li, et al, "Synthesis, Crystal Structure and Optical Properties of Non-centrosymmetric Borate, $Bi_2ZnB_2O_7$" Journal of Synthetic Crystals, 36, pp. 1005-1010, 2007.

Ali Hussain, et al, "Specific features of second order optical susceptibilities for a complex borate crystal $Bi_2ZnB_2O_7$: Experiment and theory", Current Opinion in Solid-State and Materials Science, 11, pp. 33-39, 2007.

In the discussion of the present invention, space group of a crystal refers to a mathematical description of the symmetry inherent in the structure.

The growth of this crystal may be carried out using contemporary techniques such as Bridgeman growth or Kyropoulos growth or Czochralski growth or growth using the gradient freeze method.

In the Czochralski growth method, a compound is placed in a crucible, and the crucible is heater by a heating element so that the compound is melted. Then, a seed crystal is lowered gradually to touch the liquid surface slightly. At this time, the seed crystal is rotated slowly and drawn upwardly to draw out the grown crystal.

In the Kyropoulos growth method, the seed crystal is not rotated during the crystal growth and is not drawn upwardly. On the contrary, the seed crystal is solidified, cooled and shrunk in the crucible.

SUMMARY OF THE INVENTION

It is therefore an object of the present invention to provide an improved bismuth-zinc-borate ($Bi_2ZnB_2O_7$) crystal and an improved process for producing bismuth-zinc-borate ($Bi_2ZnB_2O_7$) crystals.

It is another object to provide a large-sized and transparent bismuth-zinc-borate ($Bi_2ZnB_2O_7$) nonlinear optical crystal in a size of centimeter-level.

It is still another object to provide a method for preparing the large-sized bismuth-zinc-borate nonlinear optical crystal without any flux with simple operations.

It is still yet another object to provide a method for preparing the large-sized bismuth-zinc-borate nonlinear optical crystal by using a flux with simple operations.

It is a further object to provide the applications of the nonlinear optical devices made of the $Bi_2ZnB_2O_7$ single crystals.

These and other objects may be attained in the practice of the principles of the present invention, with a large-sized bismuth-zinc-borate nonlinear optical crystal characterized by a positive biaxial optical crystal represented by the chemical formula $Bi_2ZnB_2O_7$ having cross-sectional dimensions greater than one centimeter, belonging to the space group Pba2 with the unit cell parameters being: a=10.8200 (7) Å, b=11.0014 (7) Å, c=4.8896 (3) Å, $\alpha=\beta=\gamma=90°$, Z=4 and V=582.03 (6) Å$^3$ and the Mohs' scale of hardness within a range of between 4 and 5.

The principles of the present invention may be practiced in a method for obtaining a large-sized bismuth-zinc-borate nonlinear optical crystal by a compound melt method. First, a melt is produced by heating a bismuth-zinc-borate compound in a crucible located within a crystal growth furnace, to a temperature greater than the melting point of the bismuth-zinc-borate compound. Then, the melt is maintained at a constant temperature greater than the melting point of the melt for a period of between one hour to one hundred hours. The constant temperature is then decreased to a temperature between zero and ten degrees Celsius greater than said melting point. Afterwards, a crystal is grown by lowering a seed rod supporting a seed crystal from a top of the crystal growth furnace, until the seed crystal is in physical contact with the melt of the bismuth-zinc-borate compound, and decreasing the temperature of the melt to the melting point of the bismuth-zinc-borate compound. One of the seed crystal and the crucible is rotated at a rate less than one hundred revolutions per minute and the seed rod is drawn upwardly at a drawing rate not greater than fifteen millimeters per hour. After a bismuth-zinc-borate nonlinear optical crystal has been grown to a size having cross-sectional dimensions greater than one centimeter, the drawing rate is increased to draw the crystal out of the surface of the melt. The crystal is cooled down to a room temperature at a rate of between one and one hundred degrees Celsius per hour, and is subsequently slowly removed from the crystal growth furnace.

The bismuth-zinc-borate compound maybe a mixture of a bismuth-containing compound, a zinc-containing compound and a boron-containing compound mixed according to a certain stoichiometric ratio.

The bismuth-containing compound may be one selected from a group consisting essentially of $Bi_2O_3$, $Bi(OH)_3$, $Bi(NO_3)_3$, $(BiO)_2CO_3 \cdot \frac{1}{2}H_2O$ and $Bi(C_2O_4)_3 \cdot 7H_2O$.

The zinc-containing compound may be one selected from a group consisting essentially of ZnO, $Zn(OH)_2$, $ZnCl_2$, $ZnCO_3$, $Zn(NO_3)_2$, $ZnC_2O_4 \cdot 2H_2O$ and $Zn(CH_3COO)_2 \cdot 2H_2O$.

The boron-containing compound may be one selected from a group consisting essentially of $H_3BO_3$ and $B_2O_3$.

The principles of the present invention may be practiced in a method for obtaining a large-sized bismuth-zinc-borate nonlinear optical crystal by a flux method. First, a blended solution is produced by heating a bismuth-zinc-borate compound and a flux in a crucible disposed in a crystal growth furnace, to a temperature greater than a saturation temperature of the blended solution. The blended solution is maintained at a constant temperature greater than the saturation temperature of the blended solution for a period of between one and one hundred hours. The constant temperature is then decreased to a temperature between zero and ten degrees Celsius greater than the saturation temperature of the blended solution. Then, a crystal is grown by lowering a seed rod supporting a seed crystal from a top of the crystal growth furnace, until the seed crystal is in physical contact with the blended solution, and simultaneously rotating the seed rod at a rate less than one hundred revolutions per minute, decreasing the temperature of the blended solution, cooling the crucible to a saturation temperature of the blended solution, and then decreasing the temperature of the crucible from the saturation temperature at a rate of less than five degrees Celsius per day. After a bismuth-zinc-borate nonlinear optical crystal has been grown to a size having cross-sectional dimensions greater than one centimeter, the crystal is drawn from the surface of the blended solution, and the crystal is cooled down to a room temperature at a rate of approximately 1° C./h to 100° C./h to obtain the large-sized bismuth-zinc-borate nonlinear optical crystal.

The $Bi_2O_3$ flux may belong to bismuth-containing oxides, hydroxides, nitrates, oxalates or subcarbonates.

According to still another aspect of the present invention, an optical apparatus is constructed with a laser generator generating a first laser beam, a non-linear optical crystal receiving the first laser beam generated by the laser generator and generating a second laser beam, and a filter receiving the first laser beam and the second laser beam and filtering off the first laser beam. The non-linear optical crystal is a bismuth-zinc-borate crystal.

The optical apparatus may be used in frequency doubling generators, frequency upconverters, frequency downconverters or optical parametric oscillators.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EXEMPLARY EMBODIMENTS

Figure 1:
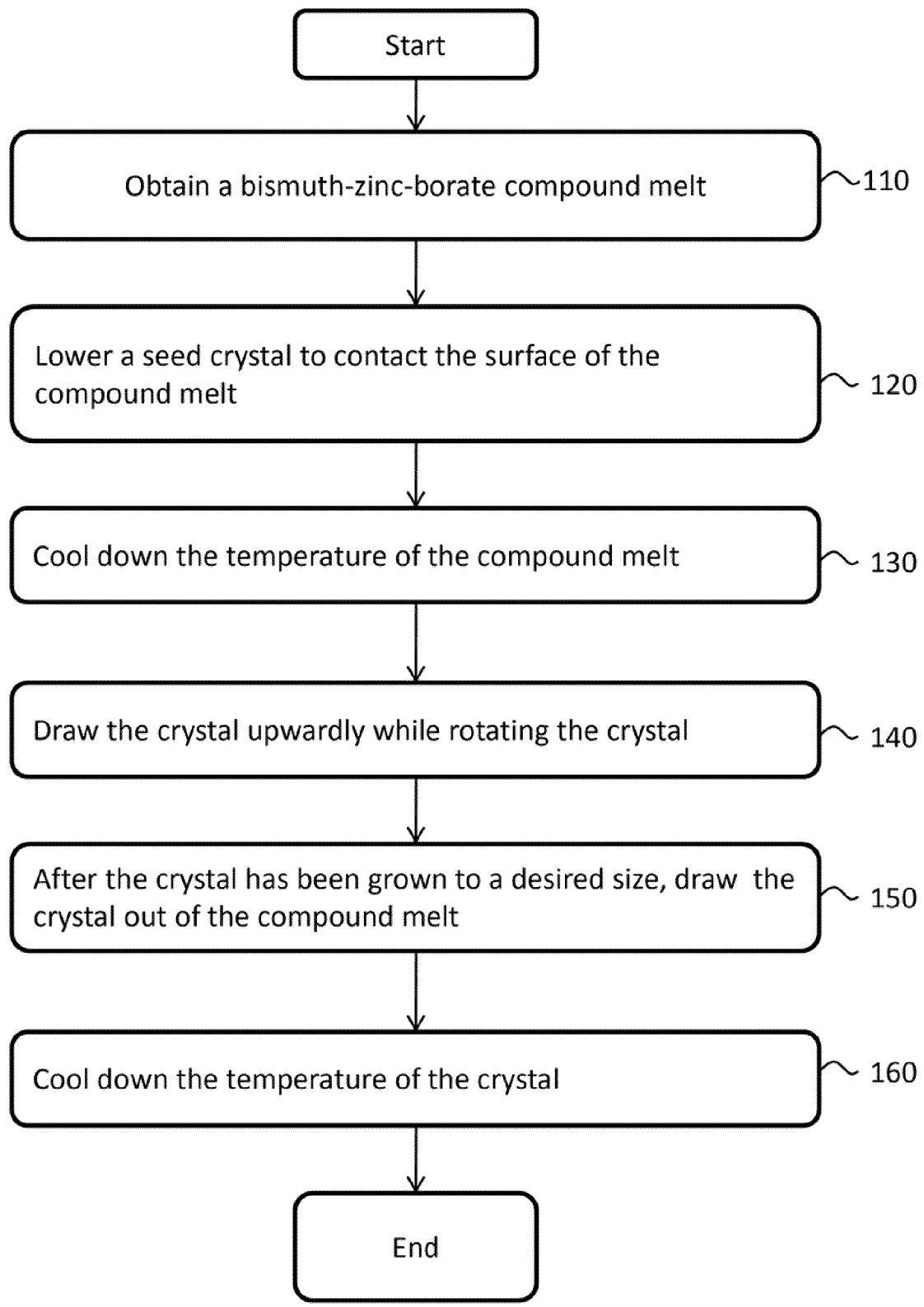
FIG. 1 is a flow chart outlining a series of process steps for preparing a large-sized bismuth-zinc-borate nonlinear optical crystal by using a compound melt method as a first embodiment according to the principles of the present invention.

Hereinafter, preferred embodiments of the present invention will be described in detail with reference to the accompanying drawings. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the entire description of the present invention, the same drawing reference numerals may be used for the same elements across various figures.

The present invention provides a large-sized bismuth-zinc-borate nonlinear optical crystal. The crystal provided in the practice of the present invention is an optically positive biaxial nonlinear crystal represented by the chemical formula $Bi_2ZnB_2O_7$. The term "nonlinear" refers to the behavior of light in nonlinear media, that is, media in which the dielectric polarization responds nonlinearly to the electric field of the light. The term "biaxial crystal" refers to a crystal having three principal indices of refraction, namely, $n_\alpha$, $n_\beta$, and $n_\gamma$, and these three principal indices of refraction are unequal, while $n_\gamma > n_\beta > n_\alpha$. A positive biaxial crystal refers to a biaxial crystal in which an acute bisectrix of the crystal is always $n_\gamma$. The term "large-sized crystal" refers to a crystal having cross-sectional dimensions greater than one centimeter.

Ideally, in the practice of the principles of this invention, each non-linear bismuth-zinc-borate crystal will exhibit linear measurements on the order of one centimeter, or greater. Typically, such linear measurements are made along a cross-sectional dimension.

FIG. 1 schematically illustrates, in a flow chart, an outline of a series of steps of one for preparing a large-sized bismuth-zinc-borate nonlinear optical crystal by using a compound melt technique, as a first embodiment according to the principles of the present invention.

As illustrated in FIG. 1, in step 110, a bismuth-zinc-borate compound is heated in a crucible in a crystal growth furnace to melt. The temperature of the bismuth-zinc-borate compound is maintained at a constant temperature that is higher than a melting point of the bismuth-zinc-borate compound for about 1 to 100 hours, Then, the temperature of the bismuth-zinc-borate compound is controlled to cool down the compound to a temperature that is within a range of about 0 to 10° C. higher than the melting point of the bismuth-zinc-borate compound. As a result, a bismuth-zinc-borate compound melt, i.e., the bismuth-zinc-borate compound in a molten state, is obtained.

In step 120, a seed crystal fixed on a seed rod is gradually lowered from a top of the crystal growth furnace until the seed crystal contacts the surface of the bismuth-zinc-borate compound melt or until the seed crystal is immersed into the bismuth-zinc-borate compound melt. The seed crystal is a bismuth-zinc-borate crystal.

In step 130, the temperature of the bismuth-zinc-borate compound melt is controlled to cool down to the melting point of the bismuth-zinc-borate compound melt. As a result, a bismuth-zinc-borate crystal begins to grow at the surface of the bismuth-zinc-borate compound melt or inside the melt.

In step 140, the seed crystal and/or the crucible are rotated at a speed within a range of approximately 0 to 100 rpm (revolutions per minute), while the crystal is drawn upwardly at a speed of approximately 0 to 15 mm/h (millimeter per hour).

In step 150, the drawing speed of the crystal from the melt surface is increased when the single crystal has been grown to a desired size.

In step 160, the temperature of the crystal is controlled to cool down the crystal to a room temperature at a rate within a range of 1-100° C./h. Then, the crystal is slowly removed out of the crystal growth furnace. Thereby, a bismuth-zinc-borate nonlinear optical crystal may be obtained.

The bismuth-zinc-borate compound used in the above process is a mixture of bismuth-containing compound, zinc-containing compound and boron-containing compound combined according to a certain stoichiometric ratio (molar ratio).

The bismuth-containing compound may be selected from a group consisting of $Bi_2O_3$, $Bi(OH)_3$, $Bi(NO_3)_3$, $(BiO)_2CO_3 \cdot \frac{1}{2}H_2O$ or $Bi(C_2O_4)_3 \cdot 7H_2O$. The zinc-containing compound may be selected from a group consisting of $ZnO$, $Zn(OH)_2$, $ZnCl_2$, $ZnCO_3$, $Zn(NO_3)_2$, $ZnC_2O_4 \cdot 2H_2O$ or $Zn(CH_3COO)_2 \cdot 2H_2O$. The boron-containing compound may be selected from a group consisting of $H_3BO_3$ and $B_2O_3$.

Figure 2:
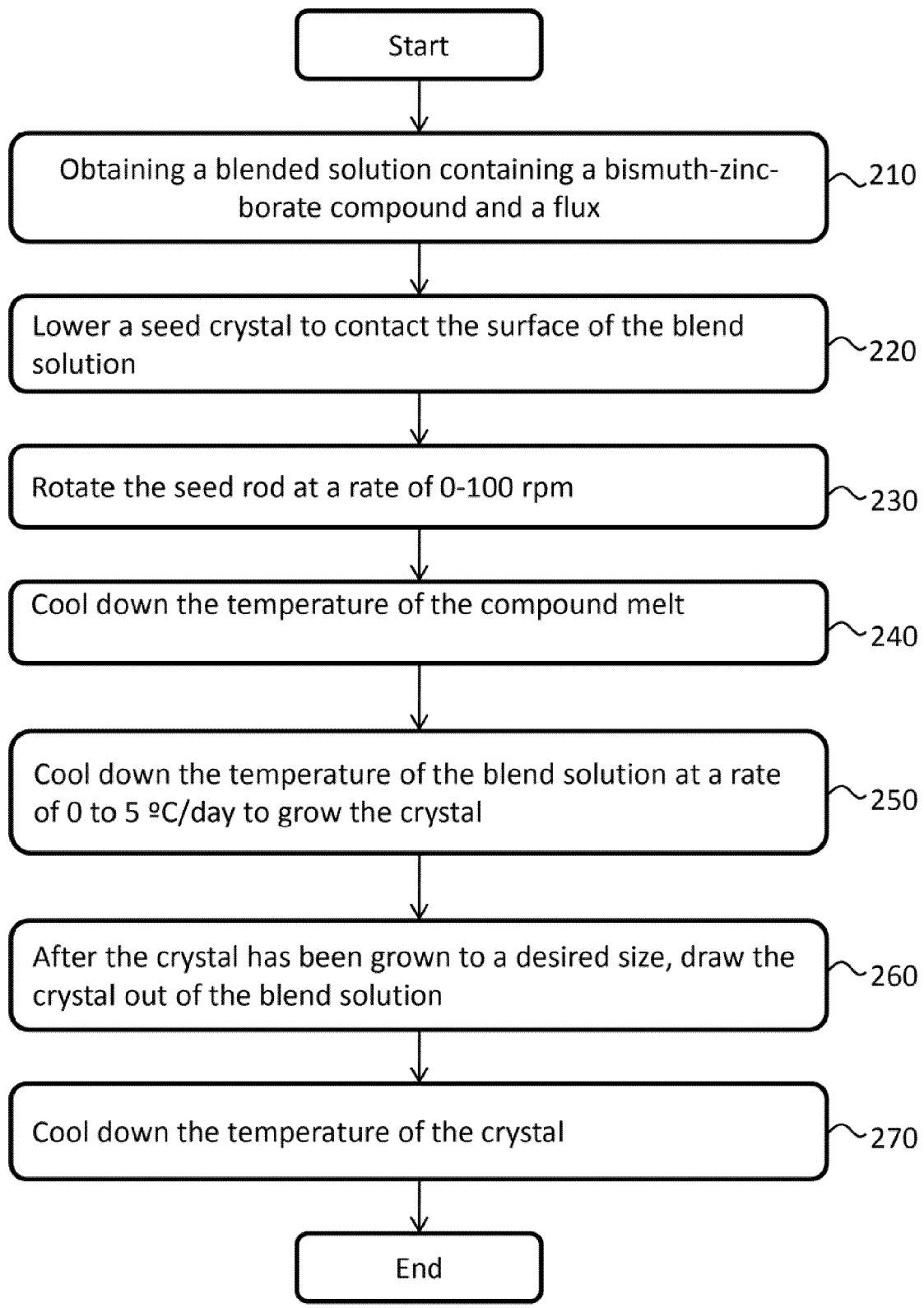
FIG. 2 is a flow chart outlining a series of process steps for preparing a large-sized bismuth-zinc-borate nonlinear optical crystal by using a flux method as a second embodiment according to the principles of the present invention.

FIG. 2 schematically illustrates, in a flow chart, an outline of the steps for preparing a large-sized bismuth-zinc-borate nonlinear optical crystal through crystal growth by using a flux method as a second embodiment according to the principles of the present invention.

As illustrated in FIG. 2, in step 210, a mixture of a bismuth-zinc-borate compound and a flux formed of $Bi_2O_3$ is heated in a crucible in a crystal growth furnace to a temperature higher than a saturation temperature of the mixture. The saturation temperature of the mixture refers a temperature at which the desired crystal, i.e., the bismuth-zinc-borate crystal, precipitates in the mixture of the bismuth-zinc-borate compound and the flux. The temperature of the mixture is maintained constant for a period of between approximately 1 hour to 100 hours, and then is controlled to cool down to a temperature which is 0 to 10° C. higher than the saturation temperature of the mixture. As a result, a blended solution containing the bismuth-zinc-borate compound and the flux is obtained. The molar ratio of the bismuth-zinc-borate compound and the flux is in a range of between approximately 1:0.1 to 1:3.

In step 220, a seed crystal fixed on a seed rod is gradually lowered from the top of the crystal growth furnace until the seed crystal contacts the surface of the blended solution as prepared in step 210, or until the seed crystal is immersed into the blended solution. The seed crystal is a bismuth-zinc-borate crystal.

In step 230, the seed rod is rotated at a rate of between approximately 0 to 100 rpm.

In step 240, the temperature of the blended solution is controlled to cool down to the saturation temperature of the blended solution.

In step 250, the temperature of the blended solution is controlled to slowly decrease at a rate of between 0 to 5° C./day. As a result, a bismuth-zinc-borate crystal is grown.

In step 260, after the bismuth-zinc-borate crystal has been grown to a desired size, the crystal is drawn out of the surface of the blended solution.

In step 270, the temperature of the crystal is controlled to cool down to the room temperature at a rate of 1 to 100° C./h. As a result, a large-sized bismuth-zinc-borate nonlinear optical crystal is obtained.

The bismuth-zinc-borate compound used in step 210 is the mixture of bismuth-containing, zinc-containing and boron-containing compounds as combined according to the same stoichiometric ratio.

The bismuth-containing compound is $Bi_2O_3$, $Bi(OH)_3$, $Bi(NO_3)_3$, $(BiO)_2$ $CO_3 \cdot \frac{1}{2}H_2O$ or $Bi(C_2O_4)_3 \cdot 7H_2O$; the zinc-containing compound is $ZnO$, $Zn(OH)_2$, $ZnCl_2$, $ZnCO_3$, $Zn(NO_3)_2$, $ZnC_2O_4 \cdot 2H_2O$ or $Zn(CH_3COO)_2 \cdot 2H_2O$; and the boron-containing compound is $H_3BO_3$ or $B_2O_3$.

The $Bi_2O_3$ flux used in step 210 belongs to the group including bismuth-containing oxides, hydroxides, nitrates, oxalates or subcarbonates.

The application of the large-sized bismuth-zinc-borate nonlinear optical crystal prepared according to the principles of the present invention may be utilized to fabricate optical devices such as frequency doubling generators, frequency upconverters, frequency downconverters or optical parametric oscillators.

The method for preparing the bismuth-zinc-borate nonlinear optical crystal without any flux as the first embodiment of the present invention is a compound melt method which grows crystals by disposing prepared and pretreated raw materials in a crucible, melting the raw materials to obtain a compound melt and growing a crystal either at the melt's surface or in the melt. This method of dipping a seed crystal into a melt and drawing the seed crystal upward is similar to a process called the Czochralski method, can be used to grow crystals from the compound melt. The method for preparing the large-sized bismuth-zinc-borate nonlinear optical crystal from the compound melt as the first embodiment of the present invention contemplates the following steps:

First, the bismuth-zinc-borate compound is heated in a crucible to melt and the temperature of the bismuth-zinc-borate compound is maintained constant at a temperature higher than a melting point of the bismuth-zinc-borate compound for 1 to 100 hours. Then, the temperature of the bismuth-zinc-borate compound is controlled to decrease to a temperature that is between approximately 0 to 10° C. higher than the melting point of the bismuth-zinc-borate compound, thus obtaining a molten melt of the compound.

Then, a process similar to the Czochralski method which involves using a seed crystal to grow crystals, can be used to grow crystals from the compound melt. The Czochralski method contemplates immersing a seed crystal into a melt and drawing the seed crystal upwardly. Specifically, when the seed crystal is used, the seed crystal is fixed on a seed rod, which is subsequently lowered from the top of a crystal growth furnace until the seed crystal contacts the surface of the compound melt prepared in the crucible in the above-mentioned first step. Then, the temperature of the compound melt is decreased to the melting point of the bismuth-zinc-borate compound melt. Afterward, the seed crystal and/or the crucible are rotated at a rate of about 0 to 100 rpm, while the crystal is drawn upwardly at a drawing rate of about 0 to 15 mm/h, whereby a single crystal is growing on the seed crystal. When the single crystal has been grown to a desired size, the drawing rate is increased, and the temperature of the single crystal is controlled to cool down to the room temperature at a rate of between approximately 1-100° C./h. Finally, the grown $Bi_2ZnB_2O_7$ nonlinear optical crystal is slowly removed out of the furnace, As an alternative to the Czochralski method, a process similar to the Kyropoulos method may be used to grow crystals from the compound melt. In the Kyropoulos method, the basic conditions for the crystal growth are the same as those conditions in the process which is similar to the above-mentioned Czochralski method. But in the Kyropoulos method, the drawing rate of the crystal from the compound melt is zero, i.e., the crystal is not drawn upwardly while the temperature of the crystal is decreased at a rate of 0 to 5° C./h to grow the $Bi_2ZnB_2O_7$ single crystal to a desired size. In the Kyropoulos method, a seed crystal may be used, or alternatively, may not be used.

As still an alternative to the Czochralski method, a process which is similar to Bridgman method may be used to grow crystals from the compound melt. In this method, a crucible may be moved horizontally or vertically along a heater (or the heater may be moved horizontally or vertically along the crucible) and a seed crystal may be used or may not be used. The crucible or heater is moved at a rate of 0.01-10 mm/h to make the melt pass through a temperature gradient zone to solidify into a crystal. This process can also be realized by slowly cooling down the melt in a crystallization furnace. The heating means can be resistivity-heating, silicon carbide-heating or silicon molybdenum-heating. The crucible can be cylindrical, with a bottom having a sharp conical shape, or a navicular shape, or other shapes.

In principle, the $Bi_2ZnB_2O_7$ crystal can be grown by the existing compound melt methods according to the principles of the present invention. When a large-sized crucible is used, a $Bi_2ZnB_2O_7$ crystal having a corresponding larger size could be obtained.

The method for preparing the $Bi_2ZnB_2O_7$ nonlinear optical crystal by using a flux as the second embodiment of the present invention is characterized by a high-temperature solution. In this method, a raw material is made from a mixture of the $Bi_2ZnB_2O_7$ compound and the $Bi_2O_3$ flux with a molar ratio of $Bi_2ZnB_2O_7$ to $Bi_2O_3$ being 1:0.1 to 1:3. The prepared raw material is put in a crucible and melted to obtain a blended solution. The crystal is grown at the surface of the solution or inside the solution. The method for preparing the large-sized $Bi_2ZnB_2O_7$ nonlinear optical crystal according to the second embodiment of the present invention includes the following steps.

First, the bismuth-zinc-borate compound and the $Bi_2O_3$ flux is homogeneously mixed according to a molar ratio of about 1:0.1 to 1:3 to obtain a mixture. Alternatively, when the bismuth-zinc-borate compound is prepared, the $Bi_2O_3$ flux may be simultaneously added into the compound to obtain the mixture. Then, the mixture is heated to about 700° C. to 1200° C. Subsequently, the temperature of the mixture is kept constant for about 1 hour to 100 hours. Then, the temperature of the mixture is controlled to cool down to a temperature that is 0 to 10° C. higher than the saturation temperature of the mixture. Thereby a blended solution containing the bismuth-zinc-borate compound and the flux is obtained.

Secondly, a seed crystal fixed on a seed rod is immersed into the blended solution. The seed rod is rotated at a rate of 0 to 100 rpm, while the blended solution is controlled to cool down to the saturation temperature of the blended solution. Afterward, the temperature of the blended solution is decreased slowly at a rate of 0 to 5° C./day to obtain the desired crystal. Then, the crystal is drawn out of the solution surface, and the temperature of the crystal is controlled to cool down to the room temperature at a rate of 1 to 100° C./h, and thereby the large-sized bismuth-zinc-borate nonlinear optical crystal is obtained.

In principle, the polycrystalline bismuth-zinc-borate raw material can be prepared by any one of the contemporary chemical synthesis methods. Among them, solid-state reaction method is preferred. Specifically, raw materials consisted of bismuth-containing, zinc-containing and boron-containing compounds in a molar ratio of 2:1:2 are mixed homogeneously and heated to carry out a solid-state reaction, and thus obtaining the compound with a chemical formula $Bi_2ZnB_2O_7$.

The chemical reaction formula for preparing the $Bi_2ZnB_2O_7$ compound may be any one of the following formulae:

$$ZnO + H_3BO_3 + Bi_2O_3 \rightarrow Bi_2ZnB_2O_7 + H_2O\uparrow \quad (1)$$

$$ZnCO_3 + B_2O_3 + Bi_2O_3 \rightarrow Bi_2ZnB_2O_7 + CO_2\uparrow \quad (2)$$

$$Zn(OH)_2 + H_3BO_3 + Bi_2O_3 \rightarrow Bi_2ZnB_2O_7 + H_2O\uparrow \quad (3)$$

$$Zn(NO_3)_2 + B_2O_3 + Bi_2O_3 \rightarrow Bi_2ZnB_2O_7 + NO_2\uparrow + O_2\uparrow \quad (4)$$

$$ZnC_2O_4 \cdot 2H_2O + H_3BO_3 + Bi_2O_3 + O_2 \rightarrow Bi_2ZnB_2O_7 + CO_2\uparrow + H_2O\uparrow \quad (5)$$

$$Zn(CH_3COO)_2 \cdot 2H_2O + B_2O_3 + Bi_2O_3 + O_2 \rightarrow Bi_2ZnB_2O_7 + CO_2\uparrow + H_2O\uparrow \quad (6)$$

$$ZnCl_2 + Bi_2O_3 + O_2 \rightarrow Bi_2ZnB_2O_7 + Cl_2\uparrow + H_2O\uparrow \quad (7)$$

In the present invention, commercial reagents and raw materials can be used as bismuth-containing, zinc-containing and boron-containing compounds.

The large-sized bismuth-zinc-borate nonlinear optical crystal prepared according to the principles of the present invention could be used in nonlinear optical devices, such as frequency doubling generators, frequency upconverters, frequency downconverters and optical parametric oscillators. Each one of the frequency doubling generators, frequency upconverters, frequency downconverters and optical parametric oscillators includes a stage in which at least one incident electromagnetic radiation beam passes through at least one piece of nonlinear optical crystal and generates at least one output electromagnetic radiation beam having a different frequency from the frequency of the incident electromagnetic radiation beam.

After a rough crystal is grown, based on the crystallographic parameters of the large-sized bismuth-zinc-borate nonlinear optical crystal, the rough crystal is oriented and cut along a phase-matching direction to obtain desired thickness and cross section dimensions. After an incident surface is polished, the processed crystal could be used as a nonlinear optical device. For example, the large-sized bismuth-zinc-borate nonlinear optical crystal prepared according to the principles of the present invention may be processed to be a crystal with cross-section dimensions of 4 mm×4 mm and a thickness of 8 mm along an incidence direction (i.e., the direction parallel to the incident light).

At the room temperature, a Q-switched Nd:YAG laser may be used as a light source. In this case, the incident light of the Q-switched Nd:YAG laser may be an infrared light with a wavelength of 1064 nm, and may incident upon the optical crystal. The output light from the optical crystal was a green laser with a wavelength of 532 nm.

The optical processing method of the large-sized bismuth-zinc-borate nonlinear optical crystal is familiar to technical personnel in the present field. The crystal provided by the present invention has no special demands for processing precision.

Figure 3:
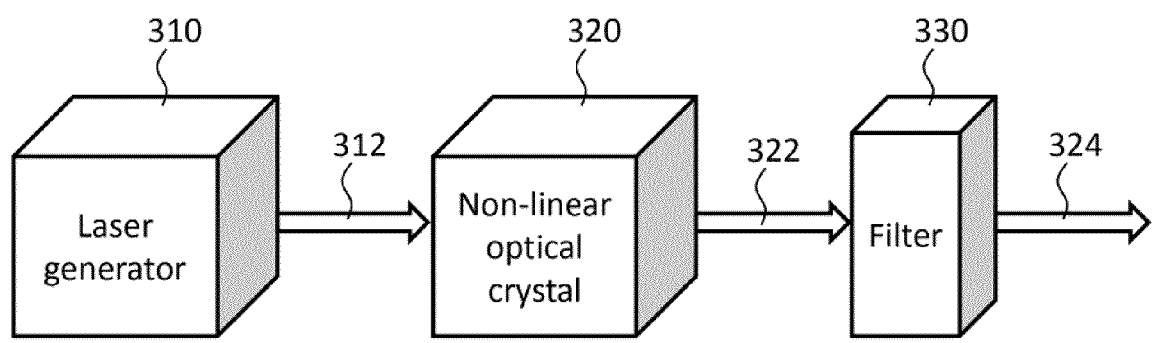
FIG. 3 is a schematic illustration of a nonlinear optical device made of the large-sized bismuth-zinc-borate crystal prepared according to the embodiment of the principles of the present invention.

FIG. 3 is a schematic illustration of an optical apparatus including the large-sized bismuth-zinc-borate crystal provided according to the principle of the present invention. The nonlinear optical device includes laser generator 310, nonlinear optical crystal 320 and filter 330. In the nonlinear optical device, laser beam 312 generated from laser generator 310 passes through nonlinear optical crystal 320, and the resulting departing beam 322 passes through filter 330, and then a desired laser beam 324 is obtained. The nonlinear optical device could be frequency doubling generators, up and down frequency converters, or optical parametric oscillators. Laser generator 310 could be Nd-doped yttrium aluminum garnet (Nd:YAG) laser generator or other laser generators. If Nd:YAG laser generator is used as the light source of the frequency doubling device, incident beam 312 is an infrared beam with a wavelength of 1064 nm. When the infrared beam passes through the bismuth-zinc-borate single crystal prepared according to the principle of the present invention, a frequency-doubled green light 322 with a wavelength of 532 nm will be produced. Then the departing beam 322 includes an infrared light with a wavelength of 1064 nm as well as a green light with a wavelength of 532 nm. The function of filter 330 is to filter off the infrared component and only allow the frequency-doubled green light to pass.

The present invention will be described in further detail as follows by means of the drawings and examples.

EXAMPLE 1

By the Melt Method

Synthesis of the bismuth-zinc-borate ($Bi_2ZnB_2O_7$) compound is performed as follows. Raw materials were sintered at 630° C. by a solid-state reaction method. The chemical reaction equation is as follows:

$$Zn(NO_3)_2 + B_2O_3 + Bi(NO_3)_3 \rightarrow Bi_2ZnB_2O_7 + NO_2\uparrow + O_2\uparrow \quad (8)$$

Specifically, $Zn(NO_3)_2$, $H_3BO_3$ and $Bi_2O_3$ were put in a mortar according to the stoichiometric ratio, and were mixed and ground carefully to obtain a mixture. The mixture was then put in a lidless corundum crucible in a size of Φ400 mm×400 mm (diameter× height) and was compacted by pressing. The crucible was put into a muffle furnace, heated slowly to 500° C. and kept constant at this temperature for 24 hours. After being cooled down, the crucible was taken out. At this time, the sample (i.e., the mixture) was relatively loose. Then the sample was taken out of the crucible, once again ground thoroughly, and put back to the crucible and sintered at 630° C. for 48 hours in the muffle furnace. The sample was then taken out, pulverized and ground in a mortar to yield the bismuth-zinc-borate compound. The product was measured by X-ray analysis. The resultant X-ray pattern was consistent with that of the powder obtained by grinding a $Bi_2ZnB_2O_7$ single crystal.

Growth of the large-sized $Bi_2ZnB_2O_7$ crystal by the Czochralski method from the melt is performed as follows. First, the synthesized $Bi_2ZnB_2O_7$ compound was put into a lidless platinum crucible in a size of Φ100 mm×100 mm. The crucible was then placed in a crystal growth furnace, heated to 750° C., kept constant at this temperature for 100 hours and then cooled down to 700° C. to obtain a compound melt.

Second, a $Bi_2ZnB_2O_7$ seed crystal fixed at the lower part of a seed rod was introduced into the crucible through a small hole at the top of the furnace till contacting the surface of the compound melt in the crucible. The temperature was lowered to 695° C. The seed rod was rotated at a rate of 50 rpm, while being drawn upwardly from the crucible at a drawing rate of 15 mm/h to grow the $Bi_2ZnB_2O_7$ crystal. After the crystal had been grown to have a desired size and the growth of crystal ended, the drawing rate was increased to draw the crystal out of the melt surface. The temperature of the crystal was then lowered to room temperature at a rate of 80° C./h. Then the crystal was slowly taken out of the furnace, and the $Bi_2ZnB_2O_7$ single crystal in a size of 60 mm×44 mm×15 mm was obtained.

According to the method as mentioned in Example 1, the $Bi_2ZnB_2O_7$ single crystal could also be obtained when the $Bi_2ZnB_2O_7$ compound was synthesized according to the following reaction equation:

$$ZnCl_2 + B_2O_3 + Bi_2O_3 + O_2 \rightarrow Bi_2ZnB_2O_7 + Cl_2\uparrow + H_2O\uparrow \quad (9).$$

EXAMPLE 2

By the Melt Method

A $Bi_2ZnB_2O_7$ compound was synthesized according to the following reaction equation:

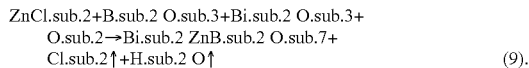
$$ZnC_2O_4 \cdot 2H_2O + H_3BO_3 + Bi(C_2O_4)_3 \cdot 7H_2O + O_2 \rightarrow Bi_2ZnB_2O_7 + CO_2\uparrow + H_2O\uparrow \quad (10)$$

The specific operation steps for synthesizing the $Bi_2ZnB_2O_7$ compound are similar to those in Example 1.

A $Bi_2ZnB_2O_7$ crystal is prepared according to the Czochralski method as follows. The synthesized $Bi_2ZnB_2O_7$ compound was put into a Φ90 mm×90 mm lidless platinum crucible which was then placed in a crystal growth furnace. The temperature was increased to 1000° C., kept constant for 20 hours, and then decreased to 697° C. A $Bi_2ZnB_2O_7$ seed crystal cut along the c-axis direction was fixed at the lower part of a seed rod by using a platinum wire and then introduced into the crucible through a small hole at the top of the furnace until contacting the melt surface. The temperature of the $Bi_2ZnB_2O_7$ compound was decreased to 695° C. The seed rod was rotated at a rate of 20 rpm and drawn upwardly at a rate of 0.1 mm/h to grow the crystal. After the growth of crystal ended, the drawing rate was increased to draw the crystal out of the melt surface. The temperature of the crystal was lowered to the room temperature at a rate of 40° C./h. Then the crystal was slowly taken out of the furnace, and the $Bi_2ZnB_2O_7$ single crystal in a size of 65 mm×45 mm×16 mm was obtained.

According to the method as mentioned in Example 2, the $Bi_2ZnB_2O_7$ single crystal could also be obtained with a $Bi_2ZnB_2O_7$ compound synthesized according to the following reaction equation:

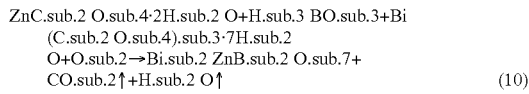
$$ZnCO_3 + B_2O_3 + Bi_2O_3 \rightarrow Bi_2ZnB_2O_7 + CO_2\uparrow \quad (11)$$

EXAMPLE 3

By the Melt Method

A $Bi_2ZnB_2O_7$ compound was synthesized according to the following reaction equation:

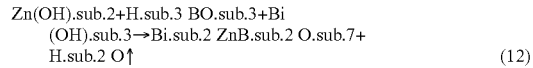
$$Zn(OH)_2 + H_3BO_3 + Bi(OH)_3 \rightarrow Bi_2ZnB_2O_7 + H_2O\uparrow \quad (12)$$

The specific operation steps for synthesizing the $Bi_2ZnB_2O_7$ compound are similar to those in Example 1.

A $Bi_2ZnB_2O_7$ crystal is prepared according to the Kyropoulos method as follows. The synthesized $Bi_2ZnB_2O_7$ compound was put into a Φ80 mm×80 mm lidless platinum crucible which was then placed in a crystal growth furnace. The temperature of the compound was increased to 1200° C., kept constant for 1 hour and then decreased to 695° C. A $Bi_2ZnB_2O_7$ seed crystal cut along the c-axis direction was fixed at the lower part of a seed rod by using a platinum wire and then introduced into the crucible through a small hole at the top of the growth furnace till contacting the melt surface. The seed rod was rotated at a rate of 100 rpm. The temperature of the compound was decreased at a rate of 5° C./day. After several days, the growth of crystal ended. The crystal was drawn out of the melt surface. The temperature was lowered to room temperature at a rate of 100° C./h. Then the crystal was slowly taken out of the furnace, and the $Bi_2ZnB_2O_7$ single crystal in a size of 50 mm×40 mm×12 mm was obtained.

According to the method as mentioned in Example 3, the $Bi_2ZnB_2O_7$ single crystal could also be obtained with a $Bi_2ZnB_2O_7$ compound synthesized according to the following reaction equation:

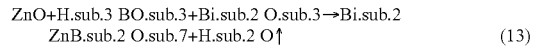
$$ZnO + H_3BO_3 + Bi_2O_3 \rightarrow Bi_2ZnB_2O_7 + H_2O\uparrow \quad (13)$$

EXAMPLE 4

By the Melt Method

A $Bi_2ZnB_2O_7$ compound was synthesized according to the following reaction equation:

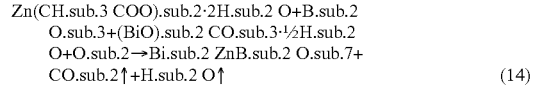
$$Zn(CH_3COO)_2 \cdot 2H_2O + B_2O_3 + (BiO)_2CO_3 \cdot \tfrac{1}{2}H_2O + O_2 \rightarrow Bi_2ZnB_2O_7 + CO_2\uparrow + H_2O\uparrow \quad (14)$$

The specific operation steps for synthesizing the $Bi_2ZnB_2O_7$ compound are similar to those in Example 1.

A $Bi_2ZnB_2O_7$ crystal is prepared according to the Kyropoulos method as follows. The synthesized $Bi_2ZnB_2O_7$ compound was put into a Φ100 mm×100 mm lidless platinum crucible which was then placed in a crystal growth furnace. The temperature was increased to 1000° C., kept constant for 24 hours and then decreased to 705° C. A $Bi_2ZnB_2O_7$ seed crystal cut along the c-axis direction was fixed at the lower part of a seed rod by using a platinum wire and then introduced into the crucible through a small hole at the top of the growth furnace till dipping into the melt. The temperature was lowered to 695° C. The seed rod was rotated at a rate of 0 (no rotation). The temperature of the compound was lowered at a rate of 0 (keeping the temperature constant) to grow the crystal. After several days, the growth of crystal ended. The crystal was drawn out of the melt surface. The temperature of the crystal was lowered to room temperature at a rate of 1° C./h. Then the crystal was slowly taken out of the furnace, and the $Bi_2ZnB_2O_7$ single crystal in a size of 60 mm×45 mm×14 mm was obtained.

According to the method as mentioned in Example 4, the $Bi_2ZnB_2O_7$ single crystal could also be obtained with a $Bi_2ZnB_2O_7$ compound synthesized according to the following reaction equation:

$$Zn(NO_3)_2 + B_2O_3 + Bi(NO_3)_3 \rightarrow Bi_2ZnB_2O_7 + NO_2\uparrow + O_2\uparrow \quad (15)$$

EXAMPLE 5

By the Melt Method

A $Bi_2ZnB_2O_7$ compound was synthesized according to the following reaction equation:

$$ZnCO_3 + B_2O_3 + Bi_2O_3 \rightarrow Bi_2ZnB_2O_7 + CO_2\uparrow \quad (16)$$

The specific operation steps for synthesizing the $Bi_2ZnB_2O_7$ compound are similar to those in Example 1.

A $Bi_2ZnB_2O_7$ crystal was prepared according to the Bridgman method as follows. The synthesized $Bi_2ZnB_2O_7$ compound was put into a Φ10 mm platinum crucible whose bottom is in a sharp conical shape. A seed crystal was placed in the bottom of the crucible which was then placed in a vertical type heating furnace. The temperature of the compound was increased to completely melt the raw materials, and then the heating power was kept constant. The crucible was lowered at a rate of 1 mm/h, and the melt was solidified from the bottom to the top of the crucible to grow into a single crystal. After the crystallization ended, the temperature of the crystal was lowered to room temperature at a rate of 20° C./h. The crucible was taken out of the furnace, and the $Bi_2ZnB_2O_7$ single crystal with a size of Φ10 mm×20 mm was obtained.

According to the method as mentioned in Example 5, the $Bi_2ZnB_2O_7$ single crystal could also be obtained with a $Bi_2ZnB_2O_7$ compound synthesized according to the following reaction equation:

$$ZnC_2O_4 \cdot 2H_2O + H_3BO_3 + Bi(C_2O_4)_3 \cdot 7H_2O + O_2 \rightarrow Bi_2ZnB_2O_7 + CO_2\uparrow + H_2O\uparrow \quad (17)$$

EXAMPLE 6

By the High-Temperature Solution Method

A $Bi_2ZnB_2O_7$ compound was synthesized according to the following reaction equation:

$$ZnCl_2 + B_2O_3 + Bi_2O_3 \rightarrow Bi_2ZnB_2O_7 + Cl_2\uparrow + H_2O\uparrow \quad (18)$$

The specific operation steps for synthesizing the $Bi_2ZnB_2O_7$ compound are similar to those in Example 1.

A $Bi_2ZnB_2O_7$ crystal was prepared according to the high-temperature solution method as follows. The synthesized $Bi_2ZnB_2O_7$ compound and a $Bi_2O_3$ flux were mixed according to a molar ratio of $Bi_2ZnB_2O_7:Bi_2O_3=1:0.1$ and put into a Φ200 mm×200 mm lidless platinum crucible. The temperature of the mixture was increased to 900° C., kept constant for 100 hours and then decreased to 685° C. to obtain a blended solution. A $Bi_2ZnB_2O_7$ seed crystal cut along the c-axis direction was fixed at the lower part of a seed rod by using a platinum wire and then introduced into the crucible through a small hole at the top of the furnace till dipping into the liquid therein. The seed crystal was rotated at a rate of 100 rpm. The temperature of the blended solution was kept constant for 0.5 hour, lowered quickly to 675° C. and then lowered at a rate of 5° C./day to grow the crystal. After the growth of crystal ended, the crystal was drawn out of the liquid surface. The temperature of the crystal was lowered to the room temperature at a rate of 100° C./h. Thus, the transparent $Bi_2ZnB_2O_7$ single crystal with a size of 100 mm×80 mm×20 mm was obtained.

According to the method as mentioned in Example 6, the $Bi_2ZnB_2O_7$ single crystal could also be obtained with a $Bi_2ZnB_2O_7$ compound synthesized by a flux consisting $(BiO)_2CO_3 \cdot \frac{1}{2}H_2O$ according to the following reaction equation:

$$ZnC_2O_4 \cdot 2H_2O + H_3BO_3 + Bi(C_2O_4)_3 \cdot 7H_2O + O_2 \rightarrow Bi_2ZnB_2O_7 + CO_2\uparrow + H_2O\uparrow \quad (19)$$

EXAMPLE 7

By the High-Temperature Solution Method

A $Bi_2ZnB_2O_7$ compound was synthesized according to the following reaction equation:

$$ZnCO_3 + B_2O_3 + Bi_2O_3 \rightarrow Bi_2ZnB_2O_7 + CO_2\uparrow \quad (20)$$

The specific operation steps for synthesizing the $Bi_2ZnB_2O_7$ compound are similar to those in Example 1.

A $Bi_2ZnB_2O_7$ crystal was prepared according to the high-temperature solution method as follows. The synthesized $Bi_2ZnB_2O_7$ compound and a $Bi_2O_3$ flux were mixed according to a molar ratio of $Bi_2ZnB_2O_7:Bi_2O_3=1:3$ and put into a Φ100 mm×100 mm lidless platinum crucible. The temperature of the mixture was increased to 900° C., kept constant for 1 hour and then lowered to 640° C. to obtain a blended solution. A $Bi_2ZnB_2O_7$ seed crystal cut along the α-axis direction was fixed at the lower part of a seed rod by using a platinum wire and then introduced into the crucible through a small hole at the top of the furnace till contacting the surface of the liquid therein. The seed crystal was rotated at a rate of 0 rpm (no rotation). The temperature of the blended solution was kept constant for 1 hour and then lowered at a rate of 0.1° C./day to grow the crystal. After the growth of crystal ended, the crystal was drawn out of the liquid surface. The temperature of the crystal was then lowered to the room temperature at a rate of 10° C./h. Thus, the transparent $Bi_2ZnB_2O_7$ single crystal with a size of 60 mm×40 mm×10 mm was obtained.

According to the method as mentioned in Example 7, the $Bi_2ZnB_2O_7$ single crystal could also be obtained with a $Bi_2ZnB_2O_7$ compound synthesized by a $Bi(OH)_3$ flux according to the following reaction equation:

$$ZnO + H_3BO_3 + Bi_2O_3 \rightarrow Bi_2ZnB_2O_7 + H_2O\uparrow \quad (21)$$

EXAMPLE 8

By the High-Temperature Solution Method

A $Bi_2ZnB_2O_7$ compound was synthesized according to the following reaction equation:

$$Zn(NO_3)_2 + B_2O_3 + Bi(NO_3)_3 \rightarrow Bi_2ZnB_2O_7 + NO_2\uparrow + O_2\uparrow \quad (22)$$

The specific operation steps for synthesizing the $Bi_2ZnB_2O_7$ compound are similar to those in Example 1.

A $Bi_2ZnB_2O_7$ crystal may be prepared according to the high-temperature solution method as follows. The synthesized $Bi_2ZnB_2O_7$ compound and a $Bi(NO_3)_3$ flux were mixed according to a molar ratio of $Bi_2ZnB_2O_7:Bi_2O_3=1:1$ and put into a $\Phi 150$ mm×150 mm lidless platinum crucible. The temperature of the mixture was increased to 900° C., kept constant for 50 hours and then lowered to 658° C. to obtain a blended solution. A $Bi_2ZnB_2O_7$ seed crystal cut along the α-axis direction was fixed at the lower part of a seed rod by using a platinum wire and then introduced into the crucible through a small hole at the top of the furnace till contacting the surface of the liquid therein. The seed crystal was rotated at a rate of 15 rpm. The temperature of the blended solution was kept constant for 1 hour, lowered quickly to 650° C., and then lowered at a rate of 0° C./day (keeping the temperature constant) to grow the crystal. After the growth of crystal ended, the crystal was drawn out of the liquid surface. The temperature of the crystal was then lowered to the room temperature at a rate of 1° C./h. Thus, the transparent $Bi_2ZnB_2O_7$ single crystal with a size of 90 mm×80 mm×20 mm was obtained.

According to the method as mentioned in Example 8, the $Bi_2ZnB_2O_7$ single crystal could also be obtained with a $Bi_2ZnB_2O_7$ compound synthesized by a flux of $Bi(C_2O_4)_3 \cdot 7H_2O$ flux according to the following reaction equation:

$$Zn(CH_3COO)_2 \cdot 2H_2O + B_2O_3 + (BiO)_2CO_3 \cdot \tfrac{1}{2}H_2O + O_2 \rightarrow Bi_2ZnB_2O_7 + CO_2\uparrow + H_2O\uparrow \quad (23).$$

EXAMPLE 9

By the High-Temperature Solution Method

A $Bi_2ZnB_2O_7$ crystal was prepared according to the high-temperature solution method as follows. First, when a $Bi_2ZnB_2O_7$ compound was prepared, a $Bi_2O_3$ flux was simultaneously added into the $Bi_2ZnB_2O_7$ compound. Specifically, a mixture of $(Zn(OH)_2, H_3BO_3$ and $Bi(OH)_3)$ used to prepare the $Bi_2ZnB_2O_7$ compound and the $Bi_2O_3$ flux were simultaneously prepared according to the molar ratio of 1:1.8, mixed homogeneously and put into a $\Phi 100$ mm×80 mm lidless platinum crucible. Then, the temperature of the mixture was increased to 1000° C., kept constant for 48 hours and then lowered to 650° C. to obtain a blended solution. A $Bi_2ZnB_2O_7$ seed crystal cut along the b-axis direction was fixed at the lower part of a seed rod by using a platinum wire and then introduced into the crucible through a small hole at the top of the furnace till contacting the surface of the blended solution therein. The seed crystal was rotated at a rate of 15 rpm. The temperature of the blended solution was kept constant for 1 hour, lowered quickly to 645° C. and then lowered at a rate of 0.5° C./day to grow the crystal. After the growth of crystal ended, the crystal was drawn out of the liquid surface. The temperature of the crystal was then lowered to the room temperature at a rate of 30° C./h. Thus, the transparent $Bi_2ZnB_2O_7$ single crystal with a size of 50 mm×30 mm×10 mm was obtained.

According to the method as mentioned in Example 9, the $Bi_2ZnB_2O_7$ single crystal could also be obtained with a $Bi_2ZnB_2O_7$ compound prepared with a mixture of $Zn(NO_3)_2, Bi_2O_3$ and $Bi(NO_3)_3$ and a $Bi(OH)_3$ flux.

EXAMPLE 10

By the Melt Method

Synthesis of a bismuth-zinc-borate ($Bi_2ZnB_2O_7$) compound is performed as follows. Raw materials were sintered at 630° C. by the solid-state reaction method. The chemical reaction equation is as follows:

$$ZnO + H_3BO_3 + Bi_2O_3 \rightarrow Bi_2ZnB_2O_7 + H_2O\uparrow \quad (24)$$

Specifically, ZnO, $H_3BO_3$, and $Bi_2O_3$ were disposed in a mortar according to the stoichiometric ratio (molar ratio), mixed and ground carefully. The mixture was then disposed in a lidless corundum crucible having a size of $\Phi 100$ mm×100 mm (diameter×height) and was compacted by pressing. The crucible was placed into a muffle furnace, heated slowly to 500° C. and kept constant at this temperature for 24 hours. After the mixture is cooled down, the crucible was taken out. At this time, the sample was relatively looser. Then the sample was taken out of the crucible, once again ground thoroughly, put back to the crucible and sintered at 630° C. for 48 hours in the muffle furnace. The sample was then taken out, pulverized and ground in a mortar to yield the bismuth-zinc-borate compound.

Growth of the large-sized $Bi_2ZnB_2O_7$ crystal by the Kyropoulos method is carried out as follows. The synthesized $Bi_2ZnB_2O_7$ compound was disposed into a $\Phi 40$ mm×40 mm lidless platinum crucible which was then placed in a crystal growth furnace. The temperature of the compound was increased to 850° C., kept constant for 20 hour and then decreased to 695° C. A $Bi_2ZnB_2O_7$ seed crystal cut along the c-axis direction was fixed at the lower part of a seed rod with a platinum wire and then introduced into the crucible through a small hole at the top of the crystal growth furnace until the seed crystal contacts the melt surface. The seed rod was rotated at a rate of 12 rpm. The temperature of the compound was decreased at a rate of 0.2° C./day to grow the crystal. After several days, the crystal has been grown to have a desired size and the growth of crystal was ended. The crystal was drawn out of the melt surface. The temperature of the crystal was lowered to room temperature at a rate of 20° C./h. Then the crystal was slowly taken out of the furnace, and the $Bi_2ZnB_2O_7$ single crystal in a size of 29 mm×23 mm×10 mm was obtained.

EXAMPLE 11

The $Bi_2ZnB_2O_7$ crystal obtained in Example 3 was processed according to a phase-matching direction into a frequency doubling device in a size of 4 mm×4 mm×8 mm and was used as nonlinear optical crystal 320 in FIG. 3. At room temperature, a Q-switched Nd:YAG laser generator was used as light source 310. Infrared beam 312 with a wavelength of 1064 nm generated from Q-switched Nd:YAG laser generator 310 passed through the $Bi_2ZnB_2O_7$ single crystal 320, and a frequency-doubled green light 322 with a wavelength of 532 nm was produced. The departing beam 322 included an infrared light with a wavelength of 1064 nm as well as a green light with a wavelength of 532 nm. The infrared component of the departing beam 322 was filtered off by filter 330 and the green laser 324 with a wavelength of 532 nm was obtained.

EXAMPLE 12

The $Bi_2ZnB_2O_7$ crystal obtained in Example 5 was processed according to the phase-matching direction into an optical parametric oscillation device in a size of 4 mm×4 mm×8 mm, and was used as optical crystal 320 in FIG. 3. At room temperature, a laser with a wavelength of 532 nm was generated from a pumping light source, and a tunable parametric oscillator output was obtained.

EXAMPLE 13

The $Bi_2ZnB_2O_7$ crystal obtained in Example 7 was processed according to the phase-matching direction into a frequency doubling device in a size of 4 mm×4 mm×8 mm and placed at the position of 320 as shown in FIG. 3. At room temperature, a Q-switched Nd:YAG laser generator was used as light source 310 and the wavelength of incident light 312 was 1064 nm. Infrared beam 312 with a wavelength of 1064 nm generated from Q-switched Nd:YAG laser generator 310 passed through the $Bi_2ZnB_2O_7$ single crystal 320, and a frequency-doubled green light with a wavelength of 532 nm was produced. The departing beam 322 included an infrared light with a wavelength of 1064 nm as well as a green light with a wavelength of 532 nm. The infrared component of the departing beam 322 was filtered off by filter 330 and the green laser 324 with a wavelength of 532 nm was obtained.

EXAMPLE 14

The $Bi_2ZnB_2O_7$ crystal obtained in Example 9 was processed according to the phase-matching direction into an optical parametric oscillation device in a size of 4 mm×4 mm×8 mm and placed at the position of 320 as shown in FIG. 3. At room temperature, a laser with a wavelength of 532 nm was used as the pumping light source, and the tunable parametric oscillator output was obtained.

Figure 4:
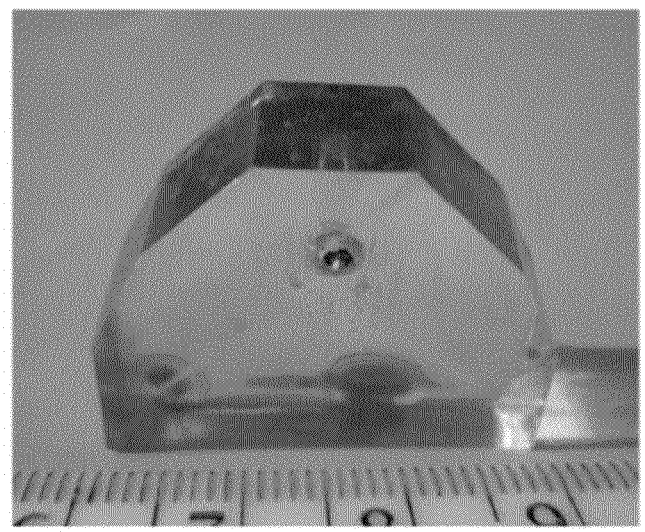
FIG. 4 is a photograph of a large-sized bismuth-zinc-borate nonlinear optical crystal prepared as an embodiment of the principles of the present invention.

FIG. 4 is a photograph of the $Bi_2ZnB_2O_7$ crystal obtained in Example 10. As shown in FIG. 4, the $Bi_2ZnB_2O_7$ crystal obtained in Example 10 has a size of 29 mm×23 mm×10 mm.

The $Bi_2ZnB_2O_7$ crystal obtained in Example 10 was investigated by a single-crystal X-ray diffraction technique on a Bruker SMART APEX II CCD diffractometer using monochromatic Mo Kα radiation ($\lambda$=0.71073 Å) at 100(2) K. As a result of the X-ray diffraction investigation, The $Bi_2ZnB_2O_7$ crystal provided in the practice of the present invention belongs to a space group Pba2 with the unit cell parameters being: a=10.8200 (7) Å, b=11.0014 (7) Å, c=4.8896 (3) Å, $\alpha=\beta=\gamma=90°$, z=4 and V=582.03 (6) $Å^3$.

Figure 5:
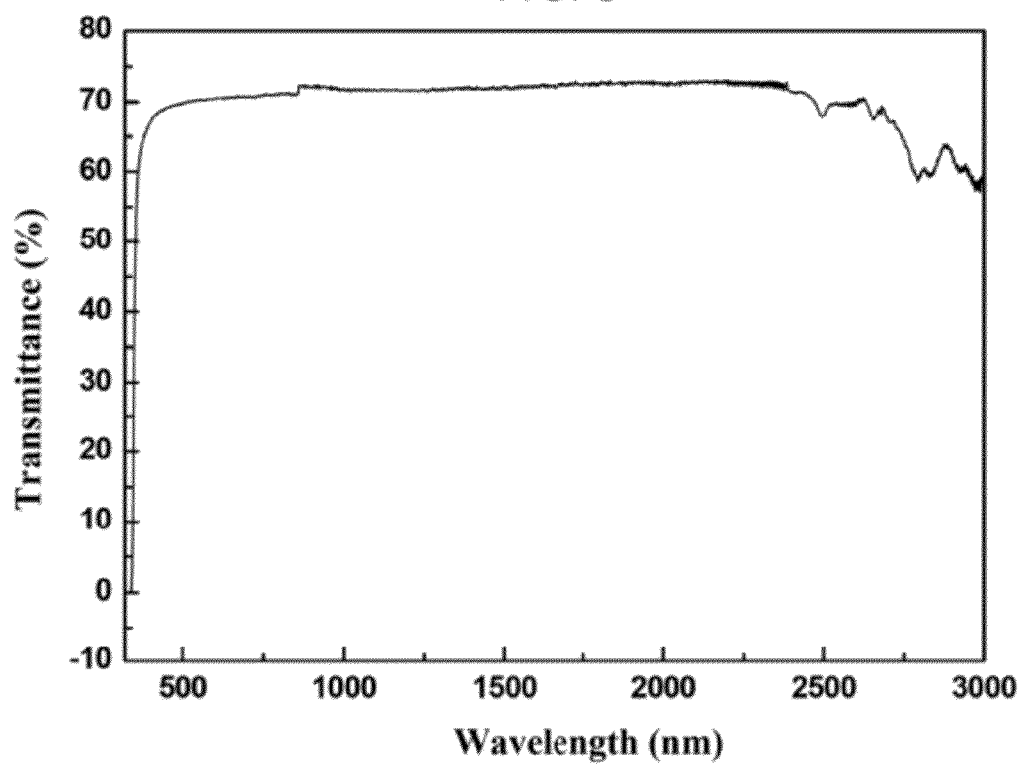
FIG. 5 is an optical transmission spectrum of the large-sized bismuth-zinc-borate nonlinear optical crystal prepared as the embodiment of the principles of the present invention.

In addition, a UV-Vis-NIR transmittance spectrum of the bismuth-zinc-borate ($Bi_2ZnB_2O_7$) crystal prepared according to the principles of the present invention was recorded at room temperature using a Perkin-Elmer Lambda 900 UV/Vis/NIR spectrophotometer and is illustrated in FIG. 5. As shown from FIG. 5, the optical transmission wavelength range of the crystal provided in the practice of the present invention is from 330 nm to 3300 nm.

The refractive indices of the bismuth-zinc-borate ($Bi_2ZnB_2O_7$) crystal prepared according to the principles of the present invention were measured by a minimum-deviation method using the Precision Goniometer-Spectrometer SGo 1.1 provided by VEB FREIBERGER PRÄZISONSMECHANIK German Democratic Republic. As a result, the birefringence magnitude of the bismuth-zinc-borate ($Bi_2ZnB_2O_7$) crystal prepared according to the principles of the present invention is in a range of 0.07 to 0.11 for the wavelength range from 400 nm to 1068 nm.

A powder second harmonic generation (SHG) test was carried out on the bismuth-zinc-borate ($Bi_2ZnB_2O_7$) crystal prepared according to the principles of the present invention was also tested by using a Kurtz-Perry method. As a result of the test, the nonlinear optical effect of the bismuth-zinc-borate ($Bi_2ZnB_2O_7$) crystal prepared according to the principles of the present invention is about 3 to 4 times that of $KH_2PO_4$ (KDP) crystal.

Finally, the bismuth-zinc-borate ($Bi_2ZnB_2O_7$) crystal prepared according to the principles is compared with the yttrium orthovanadate ($YVO_4$) crystal to measure its hardness. The Mohs scale of hardness of the yttrium orthovanadate ($YVO_4$) crystal is 4 in an α-axis direction and is 5 is a c-axis direction. By comparing the bismuth-zinc-borate ($Bi_2ZnB_2O_7$) crystal prepared according to the principles with the yttrium orthovanadate ($YVO_4$) crystal, the bismuth-zinc-borate ($Bi_2ZnB_2O_7$) crystal has a larger hardness than the hardness of the yttrium orthovanadate ($YVO_4$) crystal in the α-axis direction, and has a smaller hardness than the hardness of the yttrium orthovanadate ($YVO_4$) crystal in the c-axis direction. Therefore, the Mohs scale of hardness of the bismuth-zinc-borate ($Bi_2ZnB_2O_7$) crystal prepared according to the principles is in the range of 4 to 5.

The bismuth-zinc-borate ($Bi_2ZnB_2O_7$) crystal prepared according to the principles is easy to cut, polish and store and is non-hygroscopic. Thereby, the crystal is suitable for the fabrication of nonlinear optical devices.

The present invention provides a bismuth-zinc-borate ($Bi_2ZnB_2O_7$) nonlinear optical crystal prepared by either one of the melt method and high-temperature solution method, and nonlinear optical devices made of the $Bi_2ZnB_2O_7$ single crystal. The crystal structure of the bismuth-zinc-borate ($Bi_2ZnB_2O_7$) crystal prepared according to the principles of the present invention has a large size in a centimeter-level. Comparing the crystal preparation method provided by the present invention with the existing method for preparing the nonlinear optical crystals KTP, BBO and LBO used for the frequency conversion into blue-green waveband, both of the melt method and the high-temperature solution method are suitable to be used to grow the $Bi_2ZnB_2O_7$ single crystal because $Bi_2ZnB_2O_7$ melts congruently. The $Bi_2ZnB_2O_7$ single crystal is very easy to grow large and is transparent without any inclusion. The crystal growth method according to the principles of the present invention has many technical advantages, such as simple operation, high growth rate, low cost, and easiness to obtain relatively large crystals. The growth period of crystals such as BBO, LBO, KTP is as long as up to one month, even several months, while the growth period of the $Bi_2ZnB_2O_7$ crystal provided by the present invention is only several days. Compared to the nonlinear optical crystals such as BBO, LBO, KTP frequently used in the existing technology, the $Bi_2ZnB_2O_7$ crystal has better crystal preparation characteristics and can be grown by the melt method to obtain low-price, large-sized and high-quality crystals. The obtained crystals have the following advantages, good mechanical property, uneasiness to crack, non-hygroscopic, easiness to be processed and stored. The crystal may be applied in nonlinear optical devices such as frequency doubling generators, frequency upconverters or downconverters, and optical parametric oscillators.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the invention.

What is claimed is:

1. An optical element, comprised of:
   a large-sized bismuth-zinc-borate nonlinear optical crystal represented by the chemical formula $Bi_2ZnB_2O_7$, and having cross-sectional dimensions greater than one centimeter.

2. The optical element of claim 1, with the large-sized bismuth-zinc-borate nonlinear optical crystal being a positive biaxial optical crystal belonging to the space group Pba2, with the unit cell parameters being:
   $a=10.8200(7)$.ANG,
   $b=11.0014(7)$.ANG,
   $c=4.8896(3)$.ANG,
   $\alpha=\beta=\gamma=90$.degrees,
   $Z=4$, and
   $V=582.03(6)$.ANG.sup.3
   and a Mohs' scale of hardness being within a range of between 4 and 5.

3. A method for producing the large-sized non-linear optical crystal of claim 1, comprised of the steps of:
   producing a melt by heating a bismuth-zinc-borate compound in a crucible located within a crystal growth furnace, to a temperature greater than the melting point of the bismuth-zinc-borate compound, and maintaining the melt at a constant temperature greater than the melting point of the melt for a period of between one hour to one hundred hours, and decreasing the constant temperature to a temperature between zero and ten degrees Celsius greater than said melting point;
   growing a crystal by:
      lowering a seed rod supporting a seed crystal from a top of the crystal growth furnace, until the seed crystal is in physical contact with the melt of the bismuth-zinc-borate compound, and decreasing the temperature of the melt to the melting point of the bismuth-zinc-borate compound;
      rotating one of the seed crystal and the crucible at a rate less than one hundred revolutions per minute and drawing the seed rod upwardly at a drawing rate not greater than fifteen millimeters per hour; and
   after a bismuth-zinc-borate nonlinear optical crystal has been grown to a size having cross-sectional dimensions greater than one centimeter, increasing the drawing rate to draw the crystal out of the surface of the melt, cooling the crystal down to a room temperature at a rate of between one and one hundred degrees Celsius per hour, and slowly removing the crystal from the crystal growth furnace.

4. The method of claim 3, comprised of lowering the seed rod supporting the seed crystal until the seed crystal contacts a surface of the melt of the bismuth-zinc-borate compound, and decreasing the temperature of the melt to the melting point.

5. The method of claim 3, comprised of lowering the seed rod supporting the seed crystal until the seed crystal is dipped into the melt of the bismuth-zinc-borate compound, and decreasing the temperature of the melt to the melting point.

6. The method of claim 3, with the bismuth-zinc-borate compound producing the melt being a mixture of a bismuth-containing compound, a zinc-containing compound and a boron-containing compound mixed according to a certain stoichiometric ratio.

7. The method of claim 6, comprised of the bismuth-containing compound being selected from a group comprising:
   $Bi_2O_3$,
   $Bi(OH)_3$,
   $Bi(NO_3)_3$,
   $(BiO)_2CO_3 \cdot \frac{1}{2}H_2O$, and
   $Bi(C_2O_4)_3 \cdot 7H_2O$.

8. The method of claim 6, comprised of the zinc-containing compound being selected from a group comprising:
   ZnO,
   $Zn(OH)_2$,
   $ZnCl_2$,
   $ZnCO_3$,
   $Zn(NO_3)_2$,
   $ZnC_2O_4 \cdot 2H_2O$, and
   $Zn(CH_3COO)_2 \cdot 2H_2O$.

9. The method of claim 6, comprised of the boron-containing compound being selected from a group comprising:
   $H_3BO_3$, and
   $B_2O_3$.

10. The method for producing the large-sized non-linear optical crystal of claim 1, comprised of the steps of:
    producing a blended solution by heating a bismuth-zinc-borate compound and a flux in a crucible disposed in a crystal growth furnace, to a temperature greater than a saturation temperature of the blended solution, and maintaining the blended solution at a constant temperature greater than the saturation temperature of the blended solution for a period of between one and one hundred hours, and then decreasing the constant temperature to a temperature between zero and ten degrees Celsius greater than the saturation temperature of the blended solution; and
    growing a crystal by:
       lowering a seed rod supporting a seed crystal from a top of the crystal growth furnace, until the seed crystal is in physical contact with the blended solution, and simultaneously rotating the seed rod at a rate less than one hundred revolutions per minute, decreasing the temperature of the blended solution, cooling the crucible to a saturation temperature of the blended solution, and then decreasing the temperature of the crucible from the saturation temperature at a rate of less than five degrees Celsius per day;
    after a bismuth-zinc-borate nonlinear optical crystal has been grown to a size having cross-sectional dimensions greater than one centimeter, drawing the crystal from the surface of the blended solution, and cooling the crystal down to a room temperature at a rate of approximately 1° C./h to 100° C./h to obtain the large-sized bismuth-zinc-borate nonlinear optical crystal.

11. The method of claim 10, comprised of said flux being $Bi_2O_3$, and the molar ratio of said bismuth-zinc-borate compound to said flux being between 1:0.1 and 1:3.

12. The method in claim 11, wherein the $Bi_2O_3$ flux belongs to bismuth-containing oxides, hydroxides, nitrates, oxalates or subcarbonates.

13. The method of claim 10, comprised of lowering the seed rod supporting the seed crystal fixed until the seed crystal contacts the surface of the blended solution, and decreasing the temperature of the blended solution to the saturation temperature of the blended solution.

14. The method of claim 10, comprised of lowering the seed rod supporting the seed crystal until the seed crystal is dipped into the blended solution, and decreasing the temperature of the blended solution to the saturation temperature of the blended solution.

15. The method of claim 10, with the bismuth-zinc-borate compound producing the blended solution being a mixture of a bismuth-containing compound, a zinc-containing compound and a boron-containing compound mixed according to a stoichiometric ratio.

16. The method of claim 15, comprised of:
the bismuth-containing compound being selected from a group comprising:
$Bi_2O_3$,
$Bi(OH)_3$,
$Bi(NO_3)_3$,
$(BiO)_2CO_3 \cdot \frac{1}{2}H_2O$, and
$Bi(C_2O_4)_3 \cdot 7H_2O$;
the zinc-containing compound being selected from a group comprising:
$ZnO$,
$Zn(OH)_2$,
$ZnCl_2$,
$ZnCO_3$,
$Zn(NO_3)_2$,
$ZnC_2O_4 \cdot 2H_2O$, and
$Zn(CH_3COO)_2 \cdot 2H_2O$; and
the boron-containing compound being selected from a group comprising:
$H_3BO_3$, and
$B_2O_3$.

17. An optical apparatus incorporating the optical element of claim 1, comprising:
a laser generator generating a first laser beam;
the optical element receiving the first laser beam generated by the laser generator and generating a second laser beam, with the non-linear optical crystal being formed of a bismuth-zinc-borate crystal; and
a filter receiving the first laser beam and the second laser beam and filtering off the first laser beam.

18. The optical apparatus of claim 17, with the optical apparatus comprising one of a frequency doubling generator, a frequency upconverter, a frequency downconverter and an optical parametric oscillator.

* * * * *